United States Patent
Scherzinger et al.

(10) Patent No.: US 6,977,498 B2
(45) Date of Patent: Dec. 20, 2005

(54) MEASUREMENT PROBE, IN PARTICULAR FOR AN APPARATUS FOR MEASUREMENT OF THE THICKNESS OF THIN LAYERS

(75) Inventors: Bernhard Scherzinger, Esslingen (DE); Wolfgang Kindler, Magstadt (DE)

(73) Assignee: Immebiliengesellschaft Helmut Fischer GmbH & Co. KG, Sindelfingen (DE)

( * ) Notice: Subject to any disclaimer, the term of this patent is extended or adjusted under 35 U.S.C. 154(b) by 0 days.

(21) Appl. No.: 10/713,466

(22) Filed: Nov. 14, 2003

(65) Prior Publication Data

US 2005/0055841 A1    Mar. 17, 2005

(30) Foreign Application Priority Data

| Nov. 15, 2002 | (DE) | ................................. 102 53 560 |
| Mar. 24, 2003 | (DE) | ................................. 103 13 086 |
| Oct. 15, 2003 | (DE) | ................................. 103 48 652 |

(51) Int. Cl.[7] ............................................. G01B 7/10
(52) U.S. Cl. ........................................ 324/229; 33/834
(58) Field of Search .......................... 33/834, 832, 833, 33/559, 561; 324/230, 229, 231, 226, 236–241

(56) References Cited

U.S. PATENT DOCUMENTS

| 2,749,505 | A | * | 6/1956 | McNary ....................... 324/230 |
| 4,567,436 | A | * | 1/1986 | Koch ........................... 324/230 |
| 5,235,756 | A | * | 8/1993 | Wickenhaver ............... 33/834 |
| 6,011,391 | A | * | 1/2000 | Nix et al. .................... 324/230 |
| 6,538,434 | B1 | * | 3/2003 | Steingroever et al. ...... 324/230 |
| 6,777,930 | B2 | * | 8/2004 | Fischer ........................ 324/230 |

* cited by examiner

Primary Examiner—Christopher W. Fulton

(57) ABSTRACT

The invention relates to a measurement probe, in particular for an apparatus for measurement of the thickness of thin layers, having a housing which has at least one printed circuit board and at least one sensor element which is associated with the printed circuit board, and having a contact cup which is arranged at the lower end of the housing, characterized in that a flexible strip, which has at least one connecting line, is provided on the at least one printed circuit board, and which is passed out of the housing.

20 Claims, 3 Drawing Sheets

MEASUREMENT PROBE, IN PARTICULAR FOR AN APPARATUS FOR MEASUREMENT OF THE THICKNESS OF THIN LAYERS

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The invention relates to a measurement probe, in particular for an apparatus for measurement of the thickness of thin layers.

2. Prior Art

Measurement appliances which have a measurement probe which is placed onto the object to be measured in order to non-destructively measure the layer thickness are provided for measurement of the thickness of metallic and non-metallic layers. Known electromagnetic methods are used for this purpose, such as the magnetic induction method, as well as the eddy current method.

The measurement probe is mounted in the measurement appliance such that it is sprung and is flexible. When the measurement probe is placed against an object to be measured, it slightly enters a holder in the measurement probe. The measurement probe has sensor elements which are connected by means of thin connecting wires to a printed circuit board. The connecting wires are attached via solder points. Connecting lines are likewise provided which are passed from the printed circuit board to the exterior and are attached to the printed circuit boards by means of solder points. The connecting wires are moved with respect to the connecting points owing to the relative movement of the measurement probe with respect to the holder before and after a measurement is taken. These connecting wires tend to break immediately adjacent to the solder point. The fitting and the repair of the very thin connecting lines are very complex and costly.

BRIEF SUMMARY OF THE INVENTION

The invention is therefore based on the object of providing an arrangement which allows low-cost production of a measurement probe, in particular as a large-scale-produced item, and which has a long life.

According to the invention, this object is achieved by an apparatus for measurement of the thickness of thin layers, having a housing which has at least one printed circuit board and at least one sensor element which is associated with the printed circuit board, and having a contact cup which is arranged at the lower end of the housing, characterized in that at least one flexible strip, which has at least one connecting line, is provided on the at least one printed circuit board.

The use of at least one flexible strip which is provided on a printed circuit board and has at least one connecting line. This allows a large number of measurements to be carried out without the at least one connecting line being broken. When measurements are taken, the measurement probe is placed on a test body or sample body. The measurement probe is generally guided in a holder such that it can be moved, for example, against a spring force, so that this ensures contact with the test body or sample body. The flexible connection of the measurement probe to the printed circuit board, for further components via a flexible strip prevents kinking of the connecting lines immediately adjacent to the solder point during the movement of the measurement probe when it has been placed on and lifted off the test body or sample body, and thus prevents any risk of breaking. This results in a long life.

One refinement of the invention provides for the flexible strip to have a connecting lug at an end opposite the printed circuit board. In consequence, once the measurement probe has been inserted into a guide, it can in consequence be easily connected to a plug connector on or outside the housing, or to a data processing unit. This makes it considerably easier to mount the measurement probe in a holder and to connect it. All the connecting lines for the printed circuit board and components provided on it as well as those of the sensor elements are advantageously combined in a flexible strip, and are passed out of the housing of the measurement probe. This considerably simplifies the production, handling and assembly as well, thus allowing low-cost large-scale production.

Alternatively, it is likewise suitable for certain applications, and possible to provide for, for example, the connecting lines of the sensor elements to be provided separately from the connecting lines for the printed circuit board in a respective flexible strip.

A further refinement of the invention provides for the at least one printed circuit board to comprise a fixed layer and a flexible layer, and for the flexible layer to be separated from the fixed layer in places and to be in the form of a flexible strip. This arrangement has the advantage that it allows large-scale production for printed circuit boards, and the connecting lines can be produced at low cost using an automated process. Furthermore, this refinement results in a long-life connection between the connecting lines and the printed circuit board, with this being included in the at least one flexible strip during the production process. In the area which is held by the fixed layer, the connecting lines in the flexible layer are preferably in the form of conductor tracks, thus ensuring good and reliable contact between the conductor tracks and the connecting lines. In the other area, the connecting lines are provided in the flexible strip, which corresponds to the flexible layer during the production of the printed circuit board. In the area in which the flexible strip requires a movement range or it is intended to arrange further components, the fixed layer is removed, cut out or stamped out. Furthermore, the use of this printed circuit board makes it possible to reduce the component size since this allows the size of the components to be reduced for automated production, at a lower cost than that for manual manufacture.

In one embodiment, the flexible strip is passed out of the housing. The flexible strip protects the lines against kinking, damage and breakage.

A further refinement of the invention provides for at least one sensor element to be associated with the at least one printed circuit board, and not to be able to move with respect to the printed circuit board. This fixed association of components which cannot move and which in turn are connected to one another by connecting lines prevents the connecting lines from breaking immediately adjacent to the solder points. This makes it possible to produce a long-life arrangement and contact by means of connecting wires between at least one printed circuit board and at least one sensor element.

A further refinement of the invention provides for at least one further printed circuit board to be provided, which holds at least one sensor element. This advantageous refinement makes it possible to reduce the assembly costs and component costs by the integration of components in or on the printed circuit boards, and also to be arranged on the printed circuit boards, matching the production process. For example, two component groups can be produced in parallel during the production process and are then joined together before being integrated in a housing of the measurement probe. The first component group comprises, for example, the circuit, and the second component group comprises the sensor elements.

In the embodiments mentioned above, provision is made for the first and further printed circuit board or the first printed circuit board and the sensor elements to have contact-making points, which can be connected to one another by means of a soldered joint, in a connecting area. This makes it possible to dispense at least partially or completely with connecting wires and with the time-consuming connection process by individual soldering. The solder points or solder pads that are provided are connected to one another. This process can once again be automated, so that a prefabricated assembly can be produced from these at least two printed circuit boards or one printed circuit board and at least one sensor element, for insertion into the housing.

Alternatively, provision is made for the first printed circuit board and the at least further printed circuit board to be connected to one another by means of a flexible strip which has connecting lines. A flexible layer can thus be provided on the first or second printed circuit board, and can be arranged on the other printed circuit board with a connecting lug by means of a plug connection, or vice versa. In this exemplary embodiment, the first and the second printed circuit board can be provided such that they can move with respect to one another. The further printed circuit board preferably holds the sensor elements. In this exemplary embodiment, the further printed circuit board may also comprise only sensor elements.

A further alternative refinement provides for the first printed circuit board to be connected to a holding section, on which the sensor elements can be positioned. This holding section corresponds functionally to a further printed circuit board. The holding section is preferably provided detachably, non-detachably or integrally on the first printed circuit board, and is designed for holding and arrangement of the sensor elements. This arrangement advantageously allows the number of solder points between the first printed circuit board and the holding section to be reduced, and allows the separate connecting lines between them to be omitted. Alternatively, the connecting lines can also be passed directly from the sensor element to the first printed circuit board. The holding section is preferably metallic with good magnetic characteristics, provided that the arrangement of the sensor elements and their measurement methods are supported in this way.

A first embodiment of the invention for carrying out a magnetic induction method provides for a Hall sensor to be provided on a further printed circuit board and to have an associated field concentrator and a magnet opposite it, on the printed circuit board. The Hall sensor is connected to the printed circuit board by means of solder points. The parts are arranged such that they cannot move with respect to one another, and can be positioned with respect to one another and can be made contact with during the automated production process. The connecting lines for the Hall sensor are provided in a manner passing through the printed circuit board, so that this allows an electrical connection without moving parts by means of two solder points, which correspond to one another, on the first and further printed circuit board.

In order to use the measurement probe not only for the magnetic induction method but also for the eddy current method, the invention provides for a coil to be provided concentrically with respect to the Hall sensor on the further printed circuit board, in order to select the appropriate measurement method depending on whether metallic or non-metallic layer thicknesses are being measured, thus allowing the layer thickness to be measured using only one probe. The coil connecting lines are integrated in the printed circuit board and are configured analogously to those for the Hall sensor. Alternatively, the connecting lines may also be passed out of the further printed circuit board, and may be provided on the first printed circuit board. Since the parts cannot move with respect to one another, this does not result in any risk of breakage.

A further alternative refinement of the measurement probe provides for the first printed circuit board to be connected to a holding section, which holds not only at least one coil for an eddy current measurement method, preferably seated close to a contact cup, but also at least one primary coil and secondary coil for the magnetic induction measurement method. A Hall sensor and a further coil, concentrically with respect to the Hall sensor, can likewise be provided on the holding section.

One alternative embodiment of the measurement probe has a primary coil and a secondary coil (which are associated with a soft-iron magnet, preferably a pot-type magnet) in order to carry out a measurement using the magnetic induction method. These primary and secondary windings are associated with the at least first printed circuit board or on a holding section which is associated with the first printed circuit board and can be connected to the first printed circuit board by means, for example, of a flexible strip or by means of separate connecting lines. Once installed, these parts are positioned such that they cannot move with respect to one another.

The at least first printed circuit board for the measurement probe has an oscillator. This allows the critical conductance path between the oscillator and the coil to be kept short, thus improving the quality of the measurement and making it possible to reduce the line cross section. Further components which are required for the circuit, evaluation and/or outputting of data may be provided.

One development of the measurement probe provides for the at least first printed circuit board and the sensor elements to be firmly encapsulated in the housing by means of an electrically non-conductive compound. The flexible connecting lines are passed out of the housing via an opening. The introduction of the compound secures the positions of the components with respect to one another, thus preventing any risk of breakage as well as weakening the contact points as a result of vibration during use and during transport of the measurement probe.

One refinement of the invention provides for at least part of the at least first printed circuit board to be passed out of a cover of the housing through a recess, which is preferably in the form of a slot. The cover is preferably metallic. Bonding can be provided in a simple manner by means of a solder joint between the cover and the printed circuit board.

In order to apply only bending stress to the flexible strip which is passed to the exterior from the housing of the measurement probe, a pin or a groove is provided on the housing of the measurement probe, in order to act as a rotation prevention means together with a complementary element of the holder for the measurement probe.

The housing of the measurement probe is held in a holder by means of a guide. Axially extending projections, by way of example, can be provided for this purpose on the housing and on the holder for the measurement probe that surrounds the housing, in order to provide, for example, a three-point or five-point mounting.

The measurement probe according to the invention is preferably used in a hand-held appliance. Alternatively, it is possible for this measurement probe to be additionally surrounded by a housing which has a connecting line to a stationary measurement appliance, or has a radio module, or to be in the form of a hand-held measurement probe. The housing may, for example, have a spring-loaded guide sleeve in order to allow the measurement probe to be securely placed on and to make contact with objects to be measured.

BRIEF DESCRIPTION OF THE SEVERAL VIEWS OF THE DRAWINGS

The invention as well as further advantageous embodiments and developments of it will be described and explained in more detail in the following text with reference to the example which is illustrated in the drawing. The features which can be found in the description and in the drawing may be applied according to the invention individually in their own right or in any desired combination of two or more of them. In the figures.

DETAILED DESCRIPTION OF THE INVENTION

Figure 1:
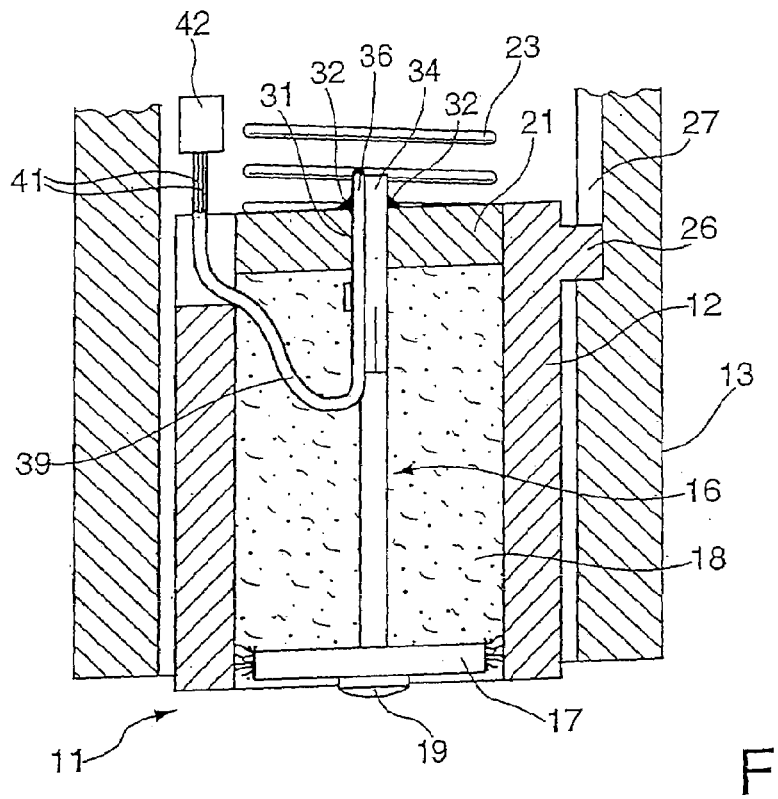
FIG. 1 shows a schematic cross section through a measurement probe according to the invention, which is positioned in a holder.

FIG. 1 shows a measurement probe 11 for an apparatus for measurement of the thickness of thin layers. This measurement probe 11 is used for non-destructive measurement of layer thicknesses. The measurement probe 11 comprises a housing 12 which is inserted in a holder 13. This holder 13 may be part of a layer thickness measurement appliance in the form of a stationary appliance or a hand-held appliance. This holder may likewise be provided in a hand-held measurement probe. The measurement probe 11 has a first printed circuit board 16, which is associated with a further printed circuit board 17. The printed circuit boards 16, 17 are firmly embedded in the housing 12 by means of a compound 18, with a contact cup 19 being provided at the lower end of the housing 12, and projecting out of the lower section of the housing 12. At an upper end, the housing 12 is closed by means of a preferably metallic cover 21. A spring element 23 acts on one outer face of the cover 21 and moves the measurement probe 11 to a lower position, with the measurement probe 11 projecting out of the holder 13. When the measurement probe 11 is placed on an object to be measured (which is not illustrated in any more detail here), the measurement probe 11 may enter the holder 13 until, for example, the holder 13 is resting on the object to be measured. In order to prevent rotation of the measurement probe 11, a projection or pin 26 is provided on the housing 12, and is guided in a groove 27 in the holder 13. A rotation prevention means such as this may also comprise any other desired embodiments which carry out the function of rotation prevention. The holder 13 is guided by means of axially extending projections, which may be provided both on the external circumference of the housing 12 and on the internal circumference of the holder 13.

The first printed circuit board 16 is passed out of the housing 12 through an opening 31, which is in the form of a slot, in the cover 21, and has contact-making points 32 which are intended for bonding purposes. Alternatively, a press fit can also be provided between the contact elements on the printed circuit board 16 and the opening 31, which is in the form of a support [sic].

The printed circuit board 16 has a fixed layer 34 and a flexible layer 36. The fixed layer 34 forms a supporting structure on which electrical components for sensor elements 37, 38 are provided. The flexible layer 36 is provided in places on the fixed layer 34, and is detached from the fixed layer 34 in places. The flexible layer 34 has a section which is in the form of a flexible strip 39 and surrounds connecting lines 41 which are passed out of the housing 12, sheathed by the flexible strip 39. A flexible strip 39 is preferably provided through which all of the connecting lines 41 which are required for the components of the measurement probe 11 are passed into or out of the housing 12. A connecting line 42 which is positioned by means of a plug connection on a further connecting element of the measurement apparatus is provided at one end of the flexible strip 39. The further connecting element may have a data processing unit such as a computation, memory, output and/or evaluation unit. This plug connection may likewise be arranged on a signal line which leads to a stationary measurement appliance.

The expression printed circuit board may be understood not only in the traditional sense, according to which conductor tracks, electrical components and the like are provided, but also just as a component which holds the connecting lines of the sensor elements in order to provide a transition into at least one flexible strip.

Figure 2:
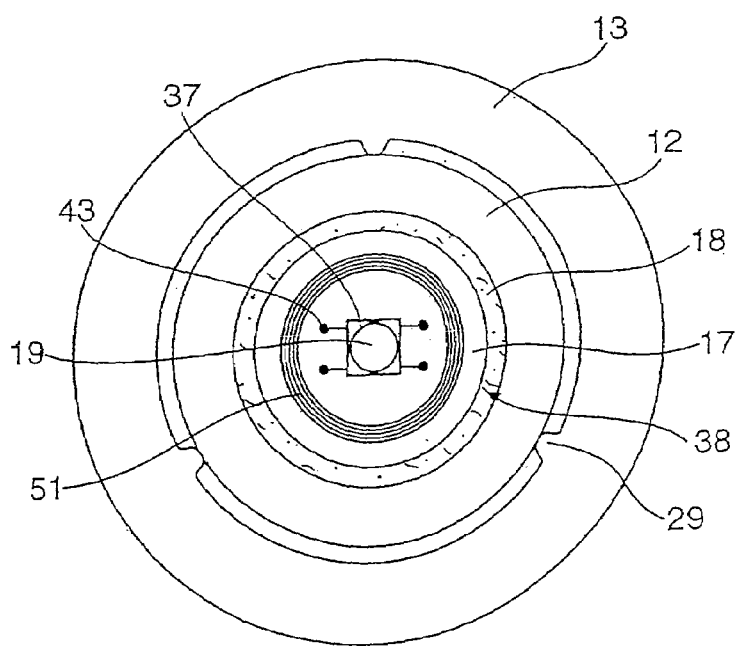
FIG. 2 shows a schematic view from underneath of the measurement probe shown in FIG. 1.
Figure 3:
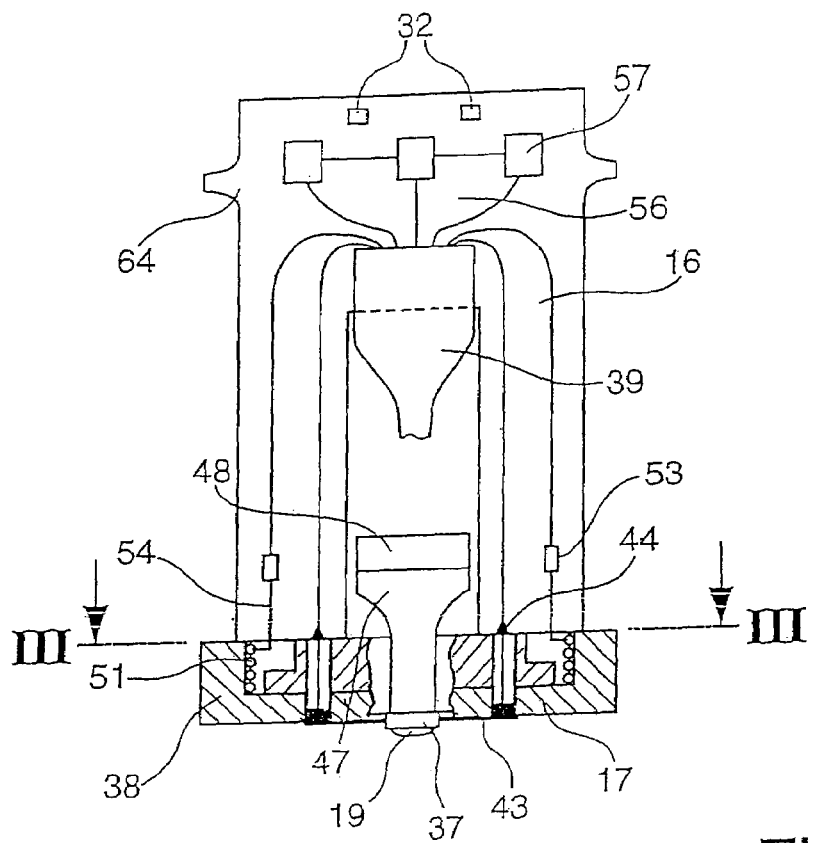
FIG. 3 shows a schematic detailed view of the components of a measurement probe.
Figure 4:
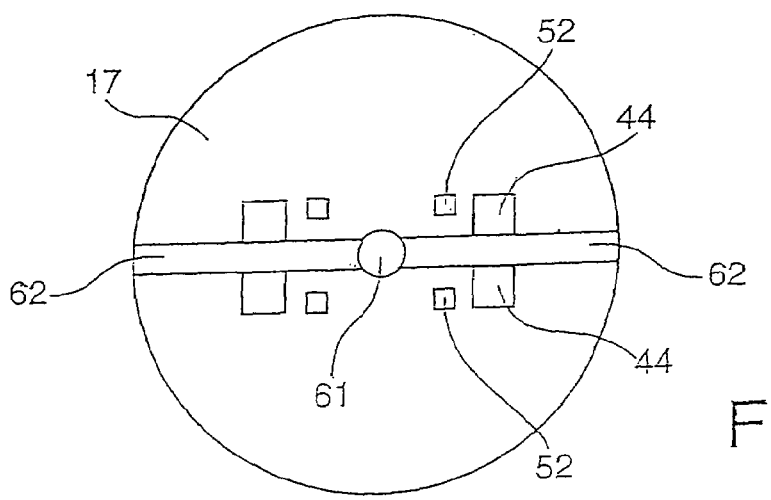
FIG. 4 shows a section illustration along the line III—III in FIG. 3.

FIGS. 2, 3 and 4 show detailed illustrations of components of the measurement probe 11. The measurement probe 11 that is illustrated in the figures allows the measurement method to be carried out either on the magnetic induction principle or on the eddy current principle. The eddy current method is used for measurement of the thickness of electrically non-conductive layers on non-ferrous metals, for example paints, varnishes, plastic on aluminium, copper, brass, stainless steel or anodized layers on aluminium. A frequency of more than 1 000 Hz is preferably used. The layer thickness measurement is carried out in a measurement range up to, for example, 1 500 $\mu$m. The magnetic induction measurement method is suitable for measurement of the thickness of non-ferrous metal layers, such as chromium, copper, zinc or the like, on steel and iron, as well as for paint, varnish and plastic layers on steel and iron. The measurement range covers, for example, a layer thickness up to 1 800 $\mu$m. A frequency of less than 300 Hz is preferably used.

The following components are provided, by way of example, for this dual measurement principle. A sensor element 37 in the form of a four-pole or six-pole Hall sensor is formed on the printed circuit board 17 and makes contact with the printed circuit board 17 via four solder points 43. A connecting line 49 to a contact point 44 is provided within the printed circuit board 37. As is illustrated in the section view in FIG. 4, there are four of these contact points 44. This contact point 44 corresponds to a contact point on the printed circuit board 16 so that, in the assembled state as shown in FIGS. 1 and 3, an electrically conductive data link is provided by means of a solder point, without any exposed connecting lines. This solder point can be produced by an automated process.

The Hall sensor 37 holds the contact cup 19 on one side. The contact cup 19 is designed to have a small height, so that the Hall sensor 37 rests as closely as possible on the planar surface of the contact cup 19, and is thus as closely as possible to the measurement surface of the object to be measured. The contact cup 19 is made of ruby or diamond. A field concentrator 47 and a magnet 48 are provided on the opposite side. The field concentrator 47 is made of soft iron with a low remanence.

Concentrically with respect to the first sensor element 37, the printed circuit board 17 holds a further sensor element 38, which is in the form of a coil 51 that is as small as possible. Seen over the diameter, the coil surrounds the Hall sensor. This coil 51 is inserted, integrated or encapsulated in the printed circuit board 17, and its connecting lines lead to contact points 52. These contact points 52 once again correspond with contact points on the printed circuit board 16. The contact points 44 and 52 on the printed circuit boards 16 and 17 can thus be connected to one another, with a through-contact, by means of a simple soldered joint. Alternatively, connecting wires for the coil 51 can be passed through the printed circuit board 17, in order to provide them on separate solder pads 53 on the first printed circuit board 16. Furthermore, the contact points 44 and 52 may be joined together. As an alternative to the coil 51 being positioned on or in the printed circuit board 17, the coil can be arranged on the field concentrator 47 close to the Hall sensor 37. The Hall sensor 37 is excited by a high-frequency alternating field to carry out measurements on iron. If a low-frequency constant field is used, the Hall sensor 37 reacts only to iron.

The printed circuit board 16 is U-shaped. The fixed layer 34 is removed in order to provide the capability for the flexible layer 36 to be moved out of the housing 12. Electrical components, for example an oscillator 57 for the coil 51, are provided in the area of the yoke 56. The flexible line strip 39 merges into the flexible layer 36 in the yoke 56. The connecting lines 41 for the sensor elements 37, 38 and the electrical components, such as the oscillator 57, are arranged on the printed circuit board 16, or are integrated and open into the flexible strip 39 in the area of the yoke 56.

As is shown in the plan view in FIG. 4, the printed circuit board 17 has a hole 61 in order to accommodate the field concentrator 47. A depression 62 which is in the form of a groove and is used for positioning and fixing of the printed circuit board 16 extends to the left and right of this hole 61. For installation, the prefabricated printed circuit boards 16, 17 are positioned with respect to one another such that the printed circuit board 16 is positioned at right angles to the printed circuit board 17 in the depression 62. The two printed circuit boards 16, 17 are then fixed with respect to one another, for example by adhesive bonding, clamping or soldering, and the contact points 44 and 52 are connected to one another by means of a soldered joint.

In the area of the yoke 56, the printed circuit board 16 has sections 64 which project beyond the side surfaces. These sections 64 are provided during the prefabrication of the printed circuit boards 16 as connections for respectively adjacent printed circuit boards 16, so that it is possible to use a multiple blank for the production of these printed circuit boards 16, with these sections being used as weak points, in order to separate the printed circuit boards 16. The contact-making points 32 are provided for bonding purposes in the upper area of the yoke 56 of the printed circuit board 16.

For exclusive measurement based on the magnetic induction method, the measurement probe 11 may have a configuration in which the sensor element 38 is not provided. The sensor element 37 may be provided on the printed circuit board 17 or else directly on the printed circuit board 16, or the printed circuit board 16 may have a section which is opposite the yoke 56 and on which the sensor element 37 is arranged directly. Alternatively, it is possible for the sensor element 37 to be attached to the printed circuit board 16 by means of connecting lines and, for example, to be arranged with respect to a flexible strip 39.

As an alternative to the use of a Hall sensor as the sensor element 37 and a coil 51 as the sensor element 38, it is also possible to provide a primary coil and a secondary coil with a magnet or pot-type magnet on the printed circuit board 17, in order to carry out a measurement on the basis of the magnetic induction method. The connection lines for the primary winding and secondary winding can be attached to the printed circuit board 16 via a flexible strip 39, or can make direct contact with contact points on the printed circuit board 16. If the components are embedded in a compound, such as a resin, encapsulation compound or filling compound or the like, the parts cannot move with respect to one another, so that there is no risk of the soldered joints breaking. In order to carry out the measurement method, the components for the magnetic induction and eddy current measurement methods are preferably integrated in or fitted to the printed circuit board 17. A Hall sensor as well as at least one first coil and a second coil, which have different diameters and/or different numbers of turns, are provided on the printed circuit board 17. The individual components can be actuated in order to carry out the measurement by means of appropriate connection of the components, depending on the measurement task, that is to say the layer thickness and the nature of the substrate material and of the coating.

Figure 5:
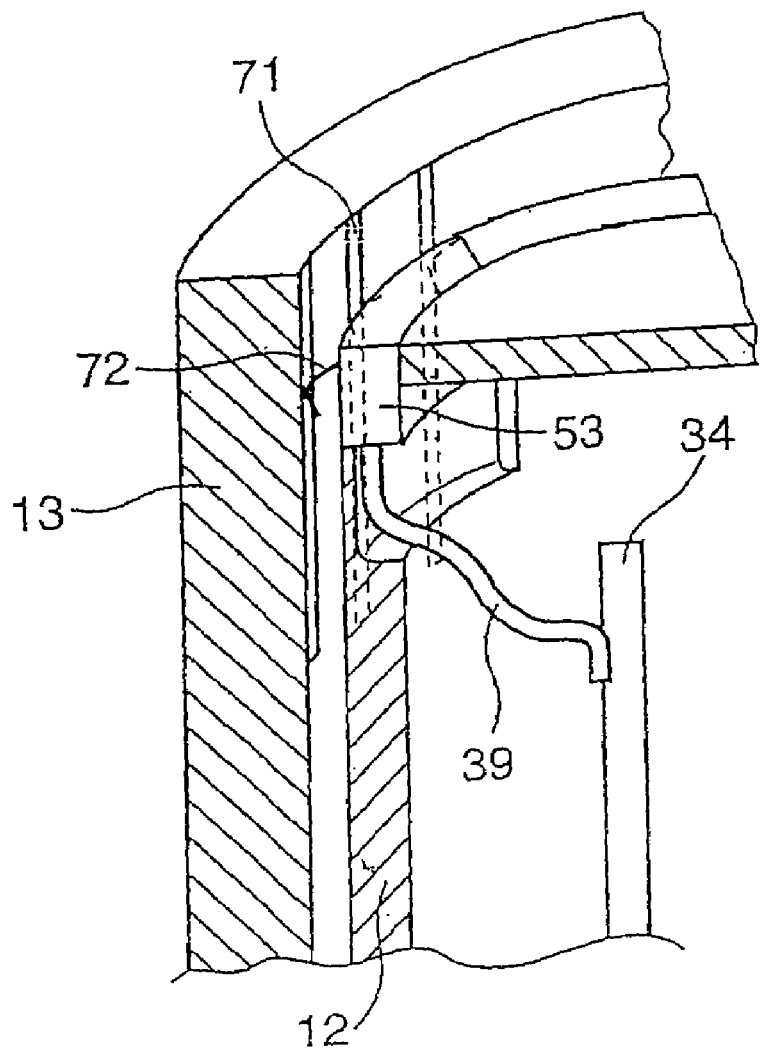
FIG. 5 shows a schematic view of an alternative way to make contact between the measurement probe and the apparatus.

FIG. 5 shows an alternative way to pass on the determined and detected information to a data processing system via the connecting line 41. By way of example, there is at least one contact rail 71 on an inner face of the holder 13, which contact rail 71 communicates with a contact spring 72 in a plug 53 which is positioned on the housing 12. The plug 53 holds the connecting lug 42. In this exemplary embodiment, the housing 12 is closed by the cover 21. Depending on the number of connecting lines 41, a corresponding number of contact springs 72 and contact rails 71 can be provided. This contact is based on the principle of a sliding contact, which allows the housing 12 to carry out a relative movement in the holder 13. Contact pins or the like can also be provided instead of a contact spring 72. An arrangement such as this can also be provided in mirror-image form. This arrangement has the advantage that it allows a connection to be made without any further installation work once the housing 12 has been inserted into the holder 13.

The embodiment of the printed circuit board comprising a fixed layer and a flexible layer is also referred to as a rigid/flexible printed circuit board. This printed circuit board may have one or more flexible strips 39, in which one or more connecting lines are held such that they are secured against being broken by movement. In the same way, the first and at least one further printed circuit board can be connected to one another by means of a flexible strip.

What is claimed is:

1. Measurement probe, for an apparatus for measurement of the thickness of thin layers, having a housing which has at least one printed circuit board and at least one sensor element which is associated with the printed circuit board, and having a contact cup which is arranged at the lower end of the housing, characterized in that the at least one printed circuit board comprises a fixed layer and a flexible layer, and the flexible layer is provided such that it is separated in places from the fixed layer, and is in the form of a flexible strip, which has at least one connecting line.

2. Measurement probe according to claim 1, characterized in that the flexible strip has a connecting lug at a free end.

3. Measurement probe according to claim 2, characterized in that the flexible strip is passed out of the housing.

4. Measurement probe according to claim 1, characterized in that the at least one printed circuit board and the at least one sensor element are arranged such that they are fixed with respect to one another.

5. Measurement probe according to claim 1, characterized in that a first printed circuit board has at least one further associated printed circuit board, which holds the at least one sensor element.

6. Measurement probe according to claim 1, characterized in that a first and at least one further printed circuit board are connected firmly to one another and have contact-making points, which are connected to one another, in mutually adjacent areas.

7. Measurement probe according to claim 6, characterized in that contact-making points are provided as solder points in the area of the first and further printed circuit board.

8. Measurement probe according to claim 1, characterized in that a first printed circuit board and at least one further printed circuit board are connected by at least one flexible strip, which has at least one connecting line.

9. Measurement probe according to claim 1, characterized in that a first and at least one further printed circuit board are integral.

10. Measurement probe according to claim 1, characterized in that an at least one further printed circuit board holds a sensor element, which is arranged by means of contact-making points, as a Hall-sensor, and is arranged opposite a field concentrator, which is held by the printed circuit board, and magnets.

11. Measurement probe according to claim 10, characterized in that the sensor element which is in the form of a Hall sensor has connecting lines which are passed through the printed circuit board and made contact with via connecting points on the first printed circuit board.

12. Measurement probe according to claim 1, characterized in that an at least one further printed circuit board has a second sensor element, which is arranged concentrically with respect to the first sensor element and is in the form of a coil whose connecting lines are provided on the first printed circuit board.

13. Measurement probe according to claim 1, characterized in that a holding section is fitted to a first printed circuit board and holds the sensor elements, and the holding section is formed detachably or non detachably, attached to or integrally with the first printed circuit board.

14. Measurement probe according to claim 13, characterized in that the at least one sensor element has a primary winding and a secondary winding for a magnetic induction measurement, at least one coil for an eddy current measurement method, or a combination.

15. Measurement probe according to claim 1, characterized in that a first printed circuit board has at least one oscillator.

16. Measurement probe according to claim 1, characterized in that a first printed circuit board and the at least one sensor element are firmly encapsulated in the housing by means of an electrically nonconductive compound.

17. Measurement probe according to claim 1, characterized in that a metallic cover is provided on the housing and has an opening which is preferably in the form of a slot and is intended for holding the first printed circuit board.

18. Measurement probe according to claim 1, characterized in that the housing has a projection or a depression, as a rotation prevention means, on one outer face.

19. Measurement probe according to claim 1, characterized in that an axial guide is provided on one outer face of the housing and has at least three projections which extend along the housing wall.

20. Measurement probe according to claim 1, characterized in that the housing is inserted into an apparatus for measurement of the thickness of thin layers, and the flexible strip which has at least one connecting line is connected by means of a plug connection to a data processing system or to a signal line.

* * * * *